United States Patent
Hongo et al.

(10) Patent No.: US 7,944,295 B2
(45) Date of Patent: May 17, 2011

(54) PREDISTORTER

(75) Inventors: Naoki Hongo, Kodaira (JP); Manabu Nakamura, Kodaira (JP); Takehiko Kobayashi, Kodaira (JP); Yoshihiko Akaiwa, Fukuoka (JP)

(73) Assignee: Hitachi Kokusai Electric Inc., Tokyo (JP)

(*) Notice: Subject to any disclaimer, the term of this patent is extended or adjusted under 35 U.S.C. 154(b) by 118 days.

(21) Appl. No.: 12/289,247

(22) Filed: Oct. 23, 2008

(65) Prior Publication Data

US 2009/0115513 A1 May 7, 2009

(30) Foreign Application Priority Data

Nov. 1, 2007 (JP) ................... 2007-285032

(51) Int. Cl.
*H03F 1/26* (2006.01)
(52) U.S. Cl. ..................... 330/149; 375/297
(58) Field of Classification Search .......... 330/149; 375/296–297; 455/114.3
See application file for complete search history.

(56) References Cited

U.S. PATENT DOCUMENTS

2008/0152037 A1* 6/2008 Kim et al. ............. 375/297

FOREIGN PATENT DOCUMENTS

| JP | 2004-112151 | 4/2004 |
| JP | 2005-101908 | 4/2005 |

OTHER PUBLICATIONS

Naoki Hongo et al., "A Predistorter for a Power Amplifier Affected by the Even-Order Distortion", Yagi Memorial Telecommunications Systems Laboratory, 2003 IEEE.
Guangsheng XU, et al., "An Adaptive Predistortion Method Based on Orthogonal Polynomial Expansion for Nonlinear Distortion Compensation, Part II", The Institute of Electronics, Information and Communication Engineers, IEICE Techincal Report, RCS2007-214(Mar. 2008).
Seiji Ohmori et al., "An Adaptive Predistortion Method Based on Orthogonal Polynommial Expansion for Nonlinear Distortion Compensation", The Institute of Electronics, Information and Communication Engineers, IEICE Technical Report, RCS2007-214(Jul. 2007).

* cited by examiner

*Primary Examiner* — Hieu P Nguyen
(74) *Attorney, Agent, or Firm* — Wenderoth, Lind & Ponack, L.L.P.

(57) ABSTRACT

The invention aims to converge predistortion coefficients efficiently in a predistorter adapted to compensate for distortion generated in an amplifier. Level detection means detects the level of a signal input to an amplifier. Signal acquisition means acquire a signal output from the amplifier as a feedback signal. Correspondence acquisition means updates a predistortion coefficient expressed using a set of orthogonal polynomials so that a distortion component contained in the acquired feedback signal is reduced and acquires a correspondence between the level of the signal input to the amplifier and a control coefficient for predistortion (contents of a distortion compensation table). Predistortion executing means applies distortion for predistortion with respect to the signal input to the amplifier in accordance with the control coefficient for predistortion that corresponds to the detected level based on the acquired correspondence.

3 Claims, 5 Drawing Sheets

(A) Analog filter (B) Digital filter

PREDISTORTER

BACKGROUND OF THE INVENTION

1. Field of the Invention

The present invention relates to predistorters (PDs) that use a predistortion method to compensate for nonlinear distortion generated in an amplifier and, in particular, to a predistorter in which predistortion coefficients are converged efficiently.

2. Description of the Related Art

Power amplifiers generally have linear input-output characteristics at lower input levels, while having nonlinear characteristics over a certain input level, and further provide saturated output power. Power amplifiers are normally used at operating points close to their own saturation points to achieve higher power efficiency, which causes nonlinear distortion due to the nonlinearity thereof. Such nonlinear distortion results in leakage of unnecessary signal components within and outside of the desired signal bands (into adjacent channels).

In general, amplifiers provide a complex output signal y(t) as expressed in Formula 1, where "t" is time and z(t) is a complex input signal of each amplifier.

In Formula 1, "Gain" is a real number representing the gain of the amplifier. Dn is a complex coefficient for an n-th order nonlinear distortion coefficient generated in the amplifier.

Formula 1 is a power series expansion of the input-output characteristics of the amplifier, where Gain·z(t), the first term on the right-hand side, is a linear component (desired wave), while the second and following terms on the right-hand side are nonlinear components (spurious waves).

Formula 1

$$y(t) = \text{Gain} \cdot z(t) + D_3 |z(t)|^2 z(t) + D_5 |z(t)|^4 z(t) + D_7 |z(t)|^6 z(t) + \quad \text{(Formula 1)}$$

In Formula 1, only odd-order terms, i.e., third, fifth, seventh . . . order terms are included for the reason that observing the frequency spectrum of the output signal from the amplifier, odd-order distortion spectra appear near the spectrum of the linear component Gain·z(t). On the other hand, even-ordered distortion, which appears as higher harmonic waves of two times or more of differential frequency components generated within the baseband, can be attenuated easily through a band-limiting filter (or band-pass filter) or the like.

In particular, base station apparatuses, which require higher transmission power, are subject to severe regulations on nonlinear distortion, such as ACLR (Adjacent Channel Leakage power Ratio), spurious standards, and spectrum emission masks. Thus, how to reduce nonlinear distortion has been a big problem.

One way to compensate for such nonlinear distortion in power amplifiers is to use a predistortion method. Predistortion methods can compensate for distortion generated in a power amplifier by providing reverse characteristics of AM-AM conversion and/or AM-PM conversion as nonlinear characteristics of the power amplifier preliminarily applied to the input signal of the amplifier.

FIG. 1 shows an exemplary configuration of an amplifier with a predistorter that uses a predistortion method to compensate for distortion in the power amplifier.

FIG. 2 shows an exemplary configuration of a predistortion executing section 13.

It is noted that FIGS. 1 and 2 will be referred to below in embodiments of the present invention, and here referred to only for the sake of descriptive convenience, not intended to limit the present invention unnecessarily.

Here, adaptive update algorithms for the distortion compensation table 12 include a waveform comparison method and a perturbation method in which out-of-band distortion power is a function of error.

In the waveform comparison method, an error signal is calculated in the control section 14 based on a feedback signal acquired from the A/D converter 7 (output signal from the power amplifier section 4 containing distortion) and an input signal (input from the input side into the control section 14), and an algorithm such as LMS (Least Mean Square error) is used to converge the contents of the distortion compensation table 12.

In the perturbation method, out-of-band power calculated by Fourier transforming feedback signals is used as an evaluation function, and coefficients of the predistorter 1 are changed and the one with the smallest evaluation function is selected to converge the contents of the distortion compensation table 12.

The foregoing methods have their respective features. The waveform comparison method requires considerably high accuracy for adjustment of the delay time between and the amplitude of input and output signals, and therefore requires complicated processing. On the other hand, the perturbation method, which uses only feedback signals, can be achieved with relatively simple processing, but takes a long time for convergence.

It is noted that FIG. 7 shows an exemplary configuration of a control section 101 in the case where a waveform comparison method is used as an adaptive algorithm for the coefficients of the predistorter, which will be described below in detail in an embodiment (Embodiment 4).

Patent Document 1: Japanese Unexamined Patent Application Publication No. 2004-112151

Patent Document 2: Japanese Unexamined Patent Application Publication No. 2005-101908

As for such conventional predistorters as mentioned above, there is still room for development in efficiently converging predistortion coefficients (e.g. the contents of the distortion compensation table 12) and there has been desired a further improvement in efficiency.

As a specific example, memoryless predistorters, in which coefficients in predistorters of different orders affect each other, suffer from a problem of taking a long time for adaptive convergence.

Similarly, memory effect compensation predistorters (memory effect predistorters), in which coefficients in predistorters of different orders affect each other, also suffer from a problem of taking a long time for adaptive convergence.

Combined use of such two kinds of predistorters also suffers from a problem of taking a long time for adaptive convergence because the predistorters affect each other even if the coefficients in the respective predistorters may be independent of each other.

Further, as for such conventional predistorter configurations as mentioned above (e.g. as shown in FIG. 7), there is still room for development in converging predistortion coefficients (e.g. the contents of the distortion compensation table 12) using an adaptive algorithm and there has been desired a further improvement inefficiency.

SUMMARY OF THE INVENTION

The present invention has been made in consideration of the above-described existing circumstances, and an object thereof is to provide a predistorter in which predistortion coefficients can be converged efficiently when using a predistortion method to compensate for nonlinear distortion generated in an amplifier.

In order to achieve the foregoing object, the present invention is directed to a predistorter adapted to compensate for distortion generated in an amplifier, the predistorter having the following configuration.

That is, level detection means is adapted to detect the level of a signal input to the amplifier. Signal acquisition means is adapted to acquire a signal (part thereof, for example) output from the amplifier as a feedback signal. Correspondence acquisition means is adapted to update a predistortion coefficient expressed using a set of orthogonal polynomials so that a distortion component contained in the feedback signal that is acquired by the signal acquisition means is reduced and to acquire a correspondence between the level of the signal input to the amplifier and a control coefficient for predistortion. Predistortion executing means is adapted to apply distortion for predistortion with respect to the signal input to the amplifier in accordance with the control coefficient for predistortion that corresponds to the level detected by the level detection means based on the correspondence acquired by the correspondence acquisition means.

Accordingly, a predistortion coefficient expressed using a set of orthogonal polynomials is updated and a correspondence between the level of the signal input to the amplifier and a control coefficient for predistortion is acquired, whereby the predistortion coefficient can be converged efficiently when, for example, using a predistortion method to compensate for nonlinear distortion generated in the amplifier, which allows the time required for the convergence to be shortened.

Here, various modes may be used for the degree (accuracy) of distortion compensation as long as practically available.

As an example, when detecting the level of a signal input to the amplifier, the signal may be one input to the predistorter (predistortion executing means), for example.

Also, the level of the signal may be the level of the power or amplitude, for example.

Various modes may also be used to control so that a distortion component contained in the feedback signal is reduced (preferably minimized), such as a waveform comparison method and a perturbation method.

Further, the predistortion coefficient expressed using a set of orthogonal polynomials includes one or more coefficients of odd-order, i.e., third, fifth, seventh . . . order in the case of memoryless predistorters, while one or more coefficients of even-ordered, i.e., second, fourth, sixth . . . order in the case of memory effect predistorters is included. In the case of combined use of memoryless and memory effect predistorters, both odd-order and even-ordered coefficients (multiple coefficients in total) are included.

In addition, the correspondence between the level of the signal input to the amplifier and the control coefficient for predistortion may be different from the predistortion coefficient expressed using a set of orthogonal polynomials (may be expressed using a power series as in the conventional manner). This is for the reason that coefficients in these respective expressions (orthogonal polynomial and power series) can be converted into each other.

It is noted that multiple predistortion coefficients expressed using a set of orthogonal polynomials do not affect each other and can be updated independently.

Also, the control coefficient for predistortion is for providing reverse characteristics of the nonlinear characteristics of the amplifier (such as reverse characteristics of the AM-AM and AM-PM characteristics and reverse characteristics of the memory effects) to the input signal.

Correspondence storage means may further be provided to store the correspondence between the level of the signal input to the amplifier and the control coefficient for predistortion as, for example, a table in a memory.

The predistorter according to the present invention may have the following configuration as an example.

That is, the predistortion executing means includes: first predistortion executing means that serves as a memoryless predistorter adapted to compensate for AM-AM and AM-PM characteristics; and second predistortion executing means that serves as a memory effect predistorter adapted to compensate for memory effects.

In addition, the correspondence acquisition means is adapted to update a predistortion coefficient for each of the first and second predistortion executing means expressed using a set of orthogonal polynomials and to acquire a correspondence between the level of the signal input to the amplifier and a control coefficient for predistortion for each of the first and second predistortion executing means.

Accordingly, in the case of combined use of memoryless and memory effect predistorters, the predistortion coefficients in the respective predistorters, can be converged efficiently when, for example, using a predistortion method to compensate for nonlinear distortion generated in the amplifier, which allows the time required for the convergence to be shortened.

Here, the first and second predistortion executing means (memoryless and memory effect predistorters) are configured separately and arranged in parallel, for example.

As an example, the first and second predistortion executing means (memoryless and memory effect predistorters) each acquire and store a correspondence between the level of the signal input to the amplifier and a control coefficient for predistortion.

Also, the predistortion coefficient expressed using a set of orthogonal polynomials includes coefficients for both of the memoryless and memory effect predistorters and takes into consideration the interaction between these predistorters.

The predistorter according to the present invention may have the following configuration as another example.

That is, the signal acquisition means has filter means for acquiring a signal component with frequency components of desired waves being removed from the acquired feedback signal.

In addition, the correspondence acquisition means is adapted to use the signal component acquired by the filter means in the signal acquisition means as an error signal to update a predistortion coefficient using an algorithm for reducing the error signal.

Accordingly, the signal component with frequency components of desired waves being removed from the feedback signal is used as an error signal, whereby there is no need for complicated processing (arithmetic operations) and the circuit size can be reduced in comparison with, for example, the conventional waveform comparison method. With this simplification of processing, the predistortion coefficient can be converged efficiently, which allows the time required for the convergence to be shortened.

Here, the frequency components of desired waves include frequency band components of the signal (desired waves) input to the amplifier, where the signal component with frequency components of desired waves being removed from the feedback signal is, for example, a distortion component existing outside the frequency bands of the desired waves (distortion component generated in the amplifier).

Also, the filter may be a band-limiting filter or a band-pass filter, for example.

Further, various algorithms may be used as the algorithm for reducing the error signal, such as LMS and RLS (Recursive Least Squares) algorithms.

The present invention is also directed to a predistorter (hereinafter referred to as predistorter A for illustrative purposes) adapted to compensate for distortion generated in an amplifier, the predistorter having the following configuration.

That is, level detection means is adapted to detect the level of a signal input to the amplifier. Signal acquisition means is adapted to acquire a signal output from the amplifier as a feedback signal and to acquire a signal component with frequency components of desired waves being removed from the acquired feedback signal through filter means. Correspondence acquisition means is adapted to use the signal component acquired by the filter means in the signal acquisition means as an error signal to update a predistortion coefficient using an algorithm for reducing the error signal and to acquire a correspondence between the level of the signal input to the amplifier and a control coefficient for predistortion. Predistortion executing means is adapted to apply distortion for predistortion with respect to the signal input to the amplifier in accordance with the control coefficient for predistortion that corresponds to the level detected by the level detection means based on the correspondence acquired by the correspondence acquisition means.

Accordingly, the signal component with frequency components of desired waves being removed from the feedback signal is used as an error signal, whereby there is no need for complicated processing (arithmetic operations) and the circuit size can be reduced in comparison with, for example, the conventional waveform comparison method. With this simplification of processing, the predistortion coefficient can be converged efficiently, which allows the time required for the convergence to be shortened.

Here, the predistorter A according to the present exemplary configuration may not necessarily use a set of orthogonal polynomials in order to update the predistortion coefficient.

Also, the predistortion coefficient to be updated and the control coefficient for predistortion that corresponds to the level of the signal input to the amplifier may be the same, for example.

It is noted that the present invention may be provided as a method, program, recording medium or the like.

In a method according to the present invention, means in an apparatus or system execute various processing.

A program according to the present invention is to be executed by a computer that constitutes an apparatus or system and to drive the computer as various means.

In a recording medium according to the present invention, a program to be executed by a computer that constitutes an apparatus or system is recorded in a manner readable by input means of the computer, the program making the computer execute various processing (procedures).

As described heretofore, according to the predistorter of the present invention, predistortion coefficients can be converged efficiently when using a predistortion method to compensate for nonlinear distortion generated in an amplifier.

DETAILED DESCRIPTION OF THE PREFERRED EMBODIMENTS

Embodiments of the present invention will be described with reference to the accompanying drawings.

Figure 1:
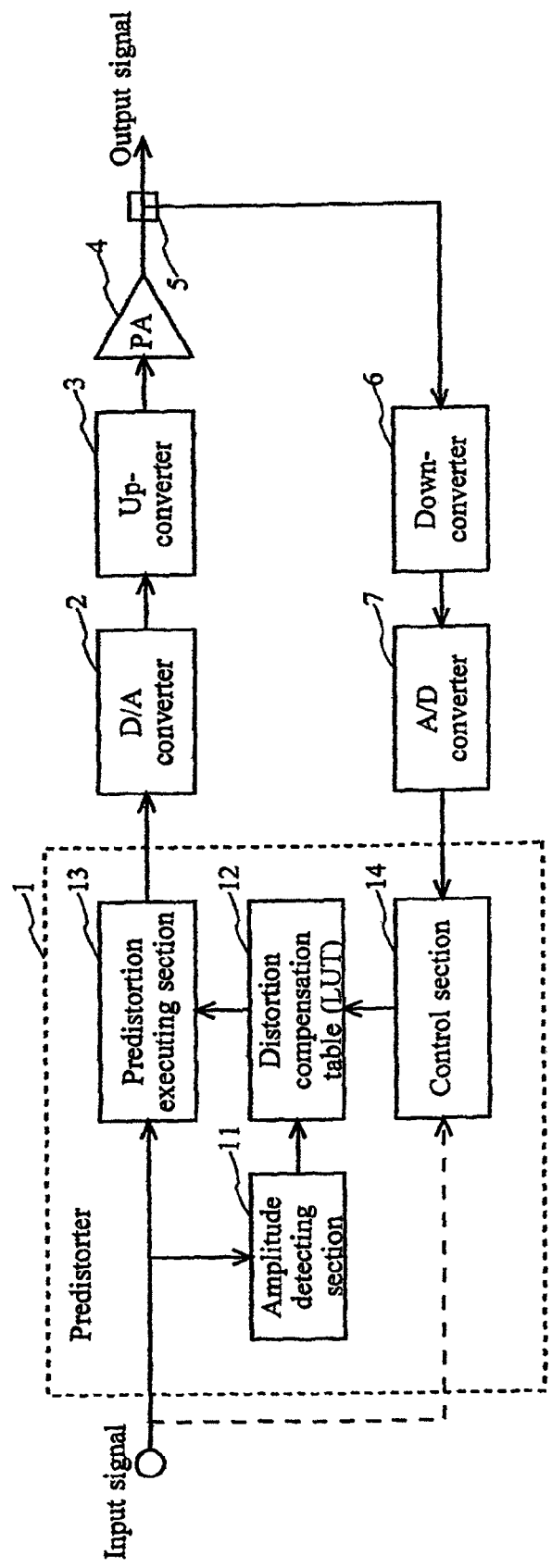
FIG. 1 is a view of an exemplary configuration of an amplifier with a predistorter according to an embodiment of the present invention.

FIG. 1 shows an exemplary configuration of an amplifier with a predistorter according to an embodiment of the present invention. The amplifier with a predistorter according to the present embodiment is provided in, for example, a transmitter in a base station apparatus.

The amplifier with a predistorter according to the present embodiment includes a predistorter (PD) 1, a D/A (Digital to Analog) converter 2, an up-converter (frequency converter) 3, a power amplifier section (PA) 4, a directional coupler 5, a down-converter (frequency converter) 6, and an A/D (Analog to Digital) converter 7.

The predistorter 1 includes an amplitude detecting section 11, a distortion compensation table 12 composed of LUTs (Look Up Tables) in a memory, a predistortion executing section 13, and a control section 14.

Operations of the amplifier with a predistorter according to the present embodiment will be described schematically.

An input signal (e.g. signal to be transmitted) to the amplifier with a predistorter is input to the predistorter 1, and then input to the amplitude detecting section 11 and the predistortion executing section 13. The input signal is also input to the control section 14 in case of necessity such as in the case where the control section 14 uses a waveform comparison method.

The amplitude detecting section 11 detects the amplitude value of the input signal and outputs the detected value to the distortion compensation table 12. This amplitude value is made correspondent as a reference argument in the distortion compensation table 12.

The distortion compensation table 12 stores a table for distortion compensation by a predistortion method. This table defines reverse characteristics of the nonlinear characteristics of an amplifier to be distortion-compensated (power amplifier section 4 in the present embodiment) and generally relates to AM-AM characteristics (amplitude) that refer to the amplitude of an input signal and AM-PM characteristics (phase).

Specifically, the distortion compensation table 12 stores a correspondence between amplitude values and control coefficients for supply to the predistortion executing section 13 and outputs a control coefficient that corresponds to the amplitude value input from the amplitude detecting section 11 to the predistortion executing section 13.

It is noted that the distortion compensation table 12 according to the present embodiment stores the correspondence relationship between amplitude values and control coefficients in a form independent of time "t."

The predistortion executing section 13 applies distortion for predistortion with respect to the input signal in accordance with the control coefficient input from the distortion compensation table 12 (result of reference to the distortion compensation table 12) to compensate for the amplitude and phase of the input signal and outputs the compensated signal to the D/A converter 2.

The D/A converter 2 digital-to-analog converts the signal input from the predistortion executing section 13 and outputs the converted signal to the up-converter 3.

The up-converter 3 up-converts the signal input from the D/A converter 2 into a radio frequency signal and outputs the converted signal to the power amplifier section 4.

The power amplifier section 4 amplifies and outputs the signal input from the up-converter 3. The output signal is to be transmitted wirelessly from an antenna (not shown in the drawing).

Here, the signal amplified through the power amplifier section 4 is preliminarily applied with distortion having reverse characteristics of the nonlinear characteristics of the power amplifier section 4 by a predistortion method, and the compensation (ideally complete cancellation) between the distortion for predistortion and distortion generated in the power amplifier section 4 allows distortion in the output signal from the power amplifier section 4 to be compensated.

The directional coupler 5 splits and acquires part of the output signal from the power amplifier section 4 as a feedback signal and outputs the feedback signal to the down-converter 6.

The down-converter 6 down-converts the feedback signal input from the directional coupler 5 into a baseband or intermediate frequency band signal and outputs the converted signal to the A/D converter 7.

The A/D converter 7 analog-to-digital converts the signal input from the down-converter 6 and outputs the converted signal to the control section 14.

Based on the signal input from the A/D converter 7, the control section 14 updates the stored contents of the distortion compensation table 12 (correspondence between amplitude values and control coefficients in the present embodiment) so that the distortion compensation by the predistortion executing section 13 becomes better. Thus updating makes it possible to adapt to, for example, temperature variations and long-term variations.

Figure 2:
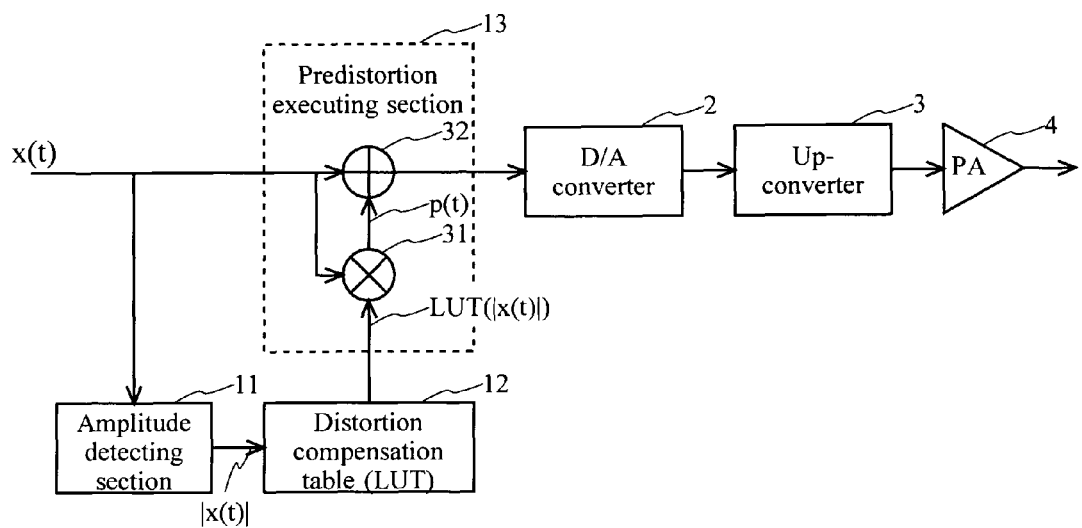
FIG. 2 is a view of an exemplary configuration of a predistortion executing section.

FIG. 2 shows an exemplary configuration of the predistortion executing section 13, including processing sections 2 to 4, 11, and 12 therearound.

The predistortion executing section 13 according to the present embodiment includes a complex multiplier 31 and a complex adder 32.

In the predistortion executing section 13 according to the present embodiment, an input signal x(t) is input to the complex multiplier 31 and adder 32.

The amplitude detecting section 11 detects the amplitude value |x(t)| of the input signal x(t), and the distortion compensation table 12 outputs a control coefficient LUT (|x(t)|) that corresponds to the amplitude value |x(t)| to the complex multiplier 31.

The complex multiplier 31 performs a complex multiplication on the input signal x(t) and the control coefficient LUT (|x(t)|) and outputs the result p(t) of the complex multiplication to the complex adder 32.

The complex adder 32 performs a complex addition on the input signal x(t) and the result p(t) of the complex multiplication and outputs the result of the complex addition to the D/A converter 2.

Embodiment 1

A first embodiment of the present invention will be described.

The present embodiment illustrates the case of using a memoryless predistorter.

Problems in the present embodiment will first be described in detail.

Figure 3:
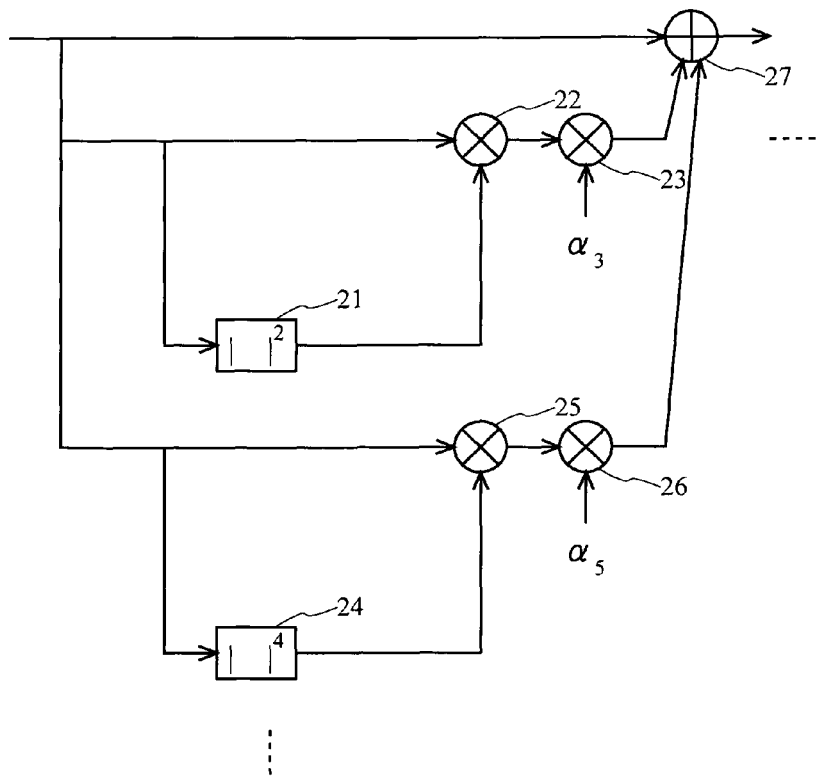
FIG. 3 is a view of an exemplary configuration of a memoryless predistorter.

FIG. 3 shows as reference an exemplary configuration of a memoryless predistorter using a power series expansion. The memoryless predistorter according to the present embodiment has an exemplary configuration of the principle of the predistorter 1 shown in FIG. 1.

The memoryless predistorter according to the present embodiment includes a square detecting section 21, a multiplier 22, and a complex multiplier 23 as a processing section for third order terms. The predistorter also includes a biquadratic detecting section 24, a multiplier 25, and a complex multiplier 26 as a processing section for fifth order terms. The predistorter further includes similar processing sections (not shown in the drawing) for seventh and following odd-order terms. It is noted that since the actual circuit cannot deal with infinite order terms, processing sections for up to any practically available order (third or any following odd-order) may be provided.

The memoryless predistorter according to the present embodiment also includes an adder 27 as a processing section common to all orders.

In the memoryless predistorter according to the present embodiment, the input signal is a complex signal.

In the processing section for third order terms, the square detecting section 21 detects (calculates, for example) the square value of the input signal and the multiplier 22 multiplies the square value by the input signal. In the resulting signal of the multiplication, the amplitude of the input signal is raised to the third power, while the phase is maintained. Then the complex multiplier 23 performs a complex multiplication on the resulting signal of the multiplication and a coefficient $\alpha_3$ in the predistorter. The coefficient $\alpha_3$ in the predistorter is a complex number, being set so that the control section (not shown in FIG. 3) can compensate for distortion.

In the processing section for fifth order terms, the biquadratic detecting section 24 detects (calculates, for example) the biquadratic value of the input signal and the multiplier 25 multiplies the biquadratic value by the input signal. In the resulting signal of the multiplication, the amplitude of the input signal is raised to the fifth power, while the phase is maintained. Then the complex multiplier 26 performs a complex multiplication on the resulting signal of the multiplication and a coefficient 5 in the predistorter. The coefficient $\alpha_5$ in the predistorter is a complex number, being set so that the control section (not shown in FIG. 3) can compensate for distortion.

The same processing as above is performed also in the processing sections for seventh and following odd-order terms.

Then the adder 27 inputs and adds (sums up) all signals output from the processing systems (complex multipliers 23, 26 . . . ) for odd-order terms and the input signal and outputs the result of the addition as a post-predistortion processing signal (to the D/A converter 2 in FIG. 1).

With reference to FIG. 2, an example of an arithmetic expression using a power series expansion according to the related art will be shown for the case where such a memoryless predistorter as shown in FIG. 3 is used.

The input signal x(t) is a complex signal.

The amplitude detecting section 11 calculates the amplitude value |x(t)| of the input signal x(t). When the input signal x(t) is as expressed in Formula 2, the amplitude value |x(t)| is as expressed in Formula 3.

Formula 2

$$x(t)=I(t)+jQ(t) \quad \text{(Formula 2)}$$

Formula 3

$$|x(t)| = \sqrt{(I(t)^2 + Q(t)^2)} \quad \text{(Formula 3)}$$

In the predistorter, a signal p(t) added to the input signal x(t) is generally as expressed in Formula 4. Here, $\alpha_i$ is a complex number, or a coefficient in the predistorter. Formula 4 is expressed in a power series, as is the case with Formula 1, and can compensate for nonlinear distortion components in Formula 1 by selecting $\alpha_i$ appropriately.

Formula 4

$$p(t) = \alpha_3 |x(t)|^2 x(t) + \alpha_5 |x(t)|^4 x(t) + \alpha_7 |x(t)|^6 x(t) + \quad \text{(Formula 4)}$$

Since p(t) is as expressed in Formula 4, the output signal LUT (|x(t)|) of the distortion compensation table 12 is as expressed in Formula 5. The control section 14 causes such data as expressed in Formula 5 to be stored in the distortion compensation table (LUT) 12 in a memory.

Formula 5

$$\text{LUT}(|x(t)|) = \alpha_3 |x(t)|^2 + \alpha_5 |x(t)|^4 + \alpha_7 |x(t)|^6 + \quad \text{(Formula 5)}$$

Assuming here that the order of the nonlinear components of the amplifier (power amplifier section 4 in the present embodiment) is limited up to the third, that is, the order of the predistorter is limited up to the third, Formulas 1 and 4 can be as expressed in Formulas 6 and 7.

Formula 6

$$y(t) = \text{Gain} \cdot z(t) + D_3 |z(t)|^2 z(t) \quad \text{(Formula 6)}$$

Formula 7

$$p(t) = \alpha_3 |x(t)|^2 x(t) \quad \text{(Formula 7)}$$

The input signal z(t) of the amplifier as expressed in Formula 8 is obtained by adding the predistortion signal p(t) expressed in Formula 7 to the input signal x(t).

Formula 8

$$\begin{aligned} z(t) &= x(t) + p(t) \\ &= x(t) + \alpha_3 |x(t)|^2 x(t) \end{aligned} \quad \text{(Formula 8)}$$

Assigning z(t) in Formula 8 to Formula 6 results in Formula 9 and further Formula 10.

Formula 9

$$y(t) = \text{Gain} \cdot \{x(t) + \alpha_3 |x(t)|^2 x(t)\} + D_3 |x(t) + \alpha_3 |x(t)|^2 x(t)|^2 \{x(t) + \alpha_3 |x(t)|^2 x(t)\} \quad \text{(Formula 9)}$$

Formula 10

$$\begin{aligned} y(t) = {}& \text{Gain} \cdot x(t) + \\ & (\text{Gain} \cdot \alpha_3 + D_3) |x(t)|^2 x(t) + D_3 (2\alpha_3 + \alpha_3^2) |x(t)|^4 x(t) + \\ & D_3 (\alpha_3^2 + 2\alpha_3^3) |x(t)|^6 x(t) + D_3 \alpha_3^3 |x(t)|^8 x(t) \end{aligned} \quad \text{(Formula 10)}$$

The first term on the right-hand side of Formula 10 represents an amplified desired signal. The second term on the right-hand side represents a third order distortion component, and the predistorter determines $\alpha_3$ so that the distortion is compensated. The third to fifth terms on the right-hand side indicate that fifth, seventh, and ninth order components are newly generated.

Therefore, when higher orders (fifth, seventh ... orders) of the predistorter are also considered in Formula 7, the third order coefficient $\alpha_3$ in the predistorter affects the fifth, seventh, and ninth order coefficients $\alpha_5$, $\alpha_7$, and $\alpha_9$ in the predistorter, resulting in that the optimum values of $\alpha_5$, $\alpha_7$, and $\alpha_9$ vary depending on the value of $\alpha_3$.

Due to such a phenomenon, the conventional methods suffer from a problem of taking a long time for adaptive convergence of coefficients ($\alpha_3$, $\alpha_5$, $\alpha_7$ ... ) in a memoryless predistorter.

It is noted that although the order of the nonlinear components of the amplifier is limited up to the third in Formula 6, considering higher orders, i.e., fifth, seventh ... orders will affect higher order coefficients in the predistorter.

Next will be described an embodiment of the present invention in detail.

In order to solve the above-described problem, the present embodiment introduces and uses a set of orthogonal polynomials as a generating polynomial for reverse characteristics of the nonlinear characteristics.

The present embodiment uses a set of orthogonal polynomials to orthogonalize multiple generating polynomials of the predistorter so that coefficients become independent not to affect each other and thereby the convergence time is shortened. The following shows an example.

First, Formula 4 is altered as expressed in Formulas 11 and 12, where $A_i$ represents a coefficient in the predistorter, $\phi_{ij}$ represents a real number, and N represents an odd number.

Formula 11

$$p(t) = A_3 \Phi_3(x(t)) + A_5 \Phi_5(x(t)) + A_7 \Phi_7(x(t)) + \ldots + A_N \Phi_N(x(t)) \quad \text{(Formula 11)}$$

Formula 12

$$\Phi_3(x(t)) = \phi_{33} |x(t)|^2 x(t)$$

$$\Phi_5(x(t)) = \phi_{53} |x(t)|^2 x(t) + \phi_{55} |x(t)|^4 x(t)$$

$$\Phi_7(x(t)) = \phi_{73} |x(t)|^2 x(t) + \phi_{75} |x(t)|^4 x(t) + \phi_{77} |x(t)|^6 x(t)$$

$$\Phi_N(x(t)) = \phi_{N3} |x(t)|^2 x(t) + \phi_{N5} |x(t)|^4 x(t) + \phi_{N7} |x(t)|^6 x(t) + \ldots + \phi_{NN} |x(t)|^{N-1} x(t) \quad \text{(Formula 12)}$$

When Formula 13 is satisfied for the input signal x(t) at a certain time (0 to T), $\phi$ ($\phi_3$ to $\phi_N$) in Formula 12 are mutually orthogonal. It is noted that the function E [•] is defined as expressed in Formula 14.

Here, T of the time (0 to T), which is the time length of data used in one update, is ideally infinity because errors are generally reduced at longer times, but may actually be any practically available value. As an example, since different signals are made orthogonal every time the contents of the distortion compensation table 12 are updated, time with a length (or more) may be used with which an amplitude distribution of the input signal sufficient for every orthogonalization can be obtained, that is, a probability density nearly equal to that of the original signal can be obtained, for example.

Formula 13

$$E[\Phi_i(x(t))\Phi_j(x(t))^*] = 1 (i=j)$$

$$E[\Phi_i(x(t))\Phi_j(x(t))^*] = 0 (i \neq j) \quad \text{(Formula 13)}$$

Formula 14

$$E[f(t)] = 1/T \int_0^T f(t) dt \quad \text{(Formula 14)}$$

Formula 13 can be satisfied by selecting $\phi_{ij}$ in Formula 12 appropriately. The value of the coefficient $\phi_{ij}$ varies depending on the input signal x(t) at the time (0 to T).

The function E [•] will hereinafter be used. Also, for simplification of description, two cases are shown including $\phi_3$ as expressed in Formula 15 and $\phi_5$ as expressed in Formula 16.

In order that $\phi_3$ and $\phi_5$ might be orthogonal, the relationship of Formula 13 has to be satisfied, resulting in equations expressed in Formulas 17, 18, and 19.

Formula 15

$$\Phi_3(x(t)) = \phi_{33}|x(t)|^2 x(t) \quad \text{(Formula 15)}$$

Formula 16

$$\Phi_5(x(t)) = \phi_{53}|x(t)|^2 x(t) + \phi_{55}|x(t)|^4 x(t) \quad \text{(Formula 16)}$$

Formula 17

$$\begin{aligned} E[\Phi_3\Phi_3^*] &= E[(\phi_{33}|x(t)|^2 x(t))\cdot(\phi_{33}|x(t)|^2 x(t))^*] \\ &= \phi_{33}^2 E[|x(t)|^6] \\ &= 1 \end{aligned} \quad \text{(Formula 17)}$$

Formula 18

$$\begin{aligned} E[\Phi_3\Phi_5^*] &= E[(\phi_{33}|x(t)|^2 x(t))\cdot(\phi_{53}|x(t)|^2 x(t) + \\ &\quad \phi_{55}|x(t)|^4 x(t))^*] \\ &= \phi_{33}\cdot(\phi_{53}E[|x(t)|^6] + \phi_{55}E[|x(t)|^8]) \\ &= 0 \end{aligned} \quad \text{(Formula 18)}$$

Formula 19

$$\begin{aligned} E[\Phi_5\Phi_5^*] &= E[(\phi_{53}|x(t)|^2 x(t) + \phi_{55}|x(t)|^4 x(t))\cdot \\ &\quad (\phi_{53}|x(t)|^2 x(t) + \phi_{55}|x(t)|^4 x(t))^*] \\ &= \phi_{53}^2 E[|x(t)|^6] + 2\phi_{53}\phi_{55}E[|x(t)|^8] + \\ &\quad \phi_{55}^2 E[|x(t)|^{10}] \\ &= 1 \end{aligned} \quad \text{(Formula 19)}$$

Since three simultaneous equations Formulas 17, 18, and are provided for three unknowns $\phi_{33}$, $\phi_{53}$, and $\phi_{55}$, these equations can be solved.

First, solving Formula 17 for $\phi_{33}$ results in Formula 20.
Next, using Formula 18 results in Formula 21.

Formula 20

$$\phi_{33} = 1/\sqrt{E[|x(t)|^6]} \quad \text{(Formula 20)}$$

Formula 21

$$\phi_{53} = -\phi_{55}(E[|x(t)|^8]/E[|x(t)|^6]) \quad \text{(Formula 21)}$$

Assigning Formula 21 to Formula 19 results in Formula and further Formula 23.

Then assigning Formula 23 to Formula 21 results in Formula 24.

A set of orthogonal polynomials can thus be generated.

Formula 22

$$\begin{aligned} &\phi_{55}^2(E[|x(t)|^8]^2/E[|x(t)|^6]) - \\ &\quad 2\phi_{55}^2(E[|x(t)|^8]^2/E[|x(t)|^6]) + \phi_{55}^2 E[|x(t)|^{10}] = 1 \end{aligned} \quad \text{(Formula 22)}$$

Formula 23

$$\phi_{55} = \sqrt{\{E[|x(t)|^6]/(E[|x(t)|^6]\cdot E[|x(t)|^{10}] - E[|x(t)|^8]^2)\}} \quad \text{(Formula 23)}$$

Formula 24

$$\phi_{53} = -(E[|x(t)|^8]/E[|x(t)|^6])/\sqrt{\{E[|x(t)|^6]/(E[|x(t)|^6]\cdot E[|x(t)|^{10}] - E[|x(t)|^8]^2)\}} \quad \text{(Formula 24)}$$

If the amplifier generates higher order nonlinear distortion, $\phi_7$, $\phi_9$ ..., which have higher order terms, are used because higher order reverse characteristics of digital predistortion (DPD) are also required.

As an example, in order that $\alpha_3$, $\alpha_5$, and $\alpha_7$ might be orthogonal, the simultaneous equation expressed in Formula 25 has to be satisfied. In this case, since six equations are provided for six unknowns $\phi_{33}$, $\phi_{53}$, $\phi_{55}$, $\phi_{73}$, $\phi_{75}$, and $\phi_{77}$, these equations can be solved. The same applies expansively to $\phi_9$ and its followings.

Formula 25=

$$E[\Phi_3\Phi_3^*]=1$$

$$E[\Phi_3\Phi_5^*]=0$$

$$E[\Phi_5\Phi_5^*]=1$$

$$E[\Phi_3\Phi_7^*]=0$$

$$E[\Phi_5\Phi_7^*]=0$$

$$E[\Phi_7\Phi_7^*]=1 \quad \text{(Formula 25)}$$

Using $A_3, A_5, A_7 \ldots A_N$ in Formula 11, $\alpha_3, \alpha_5, \alpha_7 \ldots \alpha_N$ are as expressed in Formula 26.

Formula 26

$$\begin{aligned} \alpha_3 &= \phi_{33}A_3 + \phi_{53}A_5 + \phi_{73}A_7 + \ldots + \phi_{N3}A_N \\ \alpha_5 &= \phi_{55}A_5 + \phi_{75}A_7 + \ldots + \phi_{N5}A_N \\ \alpha_7 &= \phi_{77}A_7 + \ldots + \phi_{N7}A_N \\ &\ldots \\ \alpha_N &= \phi_{NN}A_N \end{aligned} \quad \text{(Formula 26)}$$

In the present embodiment, the values of $\alpha_i$ (i=3, 5, 7 ... N) obtained by Formula 26 are applied to Formula 5 for application to the amplifier with a predistorter according to the present embodiment as shown in FIGS. 1, 2, and 3.

Thus, in the present embodiment, the coefficient $A_i$ in the predistorter affects only $\phi_i$, that is, can be obtained independently of other coefficients $A_j$ ($i \neq j$) in the predistorter, which allows the convergence time to be shortened. Specifically, the number of update times until the contents of the distortion compensation table 12 are converged from an initial state (e.g. including no information) is reduced, for example.

As described heretofore, in the amplifier with a predistorter according to the present embodiment, a set of orthogonal polynomials is used to learn the adaptive coefficients in the memoryless predistorter.

Therefore, in the amplifier with a predistorter according to the present embodiment, use of a set of orthogonal polynomials causes the adaptive coefficients in the predistorter to be made orthogonal, whereby the convergence time of the distortion compensation table 12 can be shortened, resulting in an improvement in efficiency.

It is noted that in the predistorter 1 (memoryless predistorter) according to the present embodiment, the function of the amplitude detecting section 11 constitutes level detection means for input signals; the functions of the directional coupler 5, down-converter 6, and A/D converter 7 in the feedback system constitute signal acquisition means for feedback signals; the function of the control section 14 for acquiring (updating in the present embodiment) a correspondence between the level of an input signal and a control coefficient for predistortion (contents of the distortion compensation table 12) through processing using constitutes correspondence acquisition means; the function of the distortion compensation table 12 constitutes correspondence storage means; and the function of the predistortion executing section 13 constitutes predistortion executing means. Here in the present embodiment, the feedback system can also be taken as a part of the processing section in the predistorter 1.

Embodiment 2

A second embodiment of the present invention will be described.

The present embodiment illustrates the case of using a memory effect predistorter.

In predistortion methods, it is important to compensate for memory effects as well as AM-AM and AM-PM conversions. As an example, Patent Document 2 shows a predistorter adapted to compensate for memory effects, in which baseband even-ordered distortion components fluctuate the power supply voltage through an impedance in the power supply circuit to re-modulate the input signal so that new in-band odd-order components are generated.

Problems in the present embodiment will first be described in detail.

Figure 4:
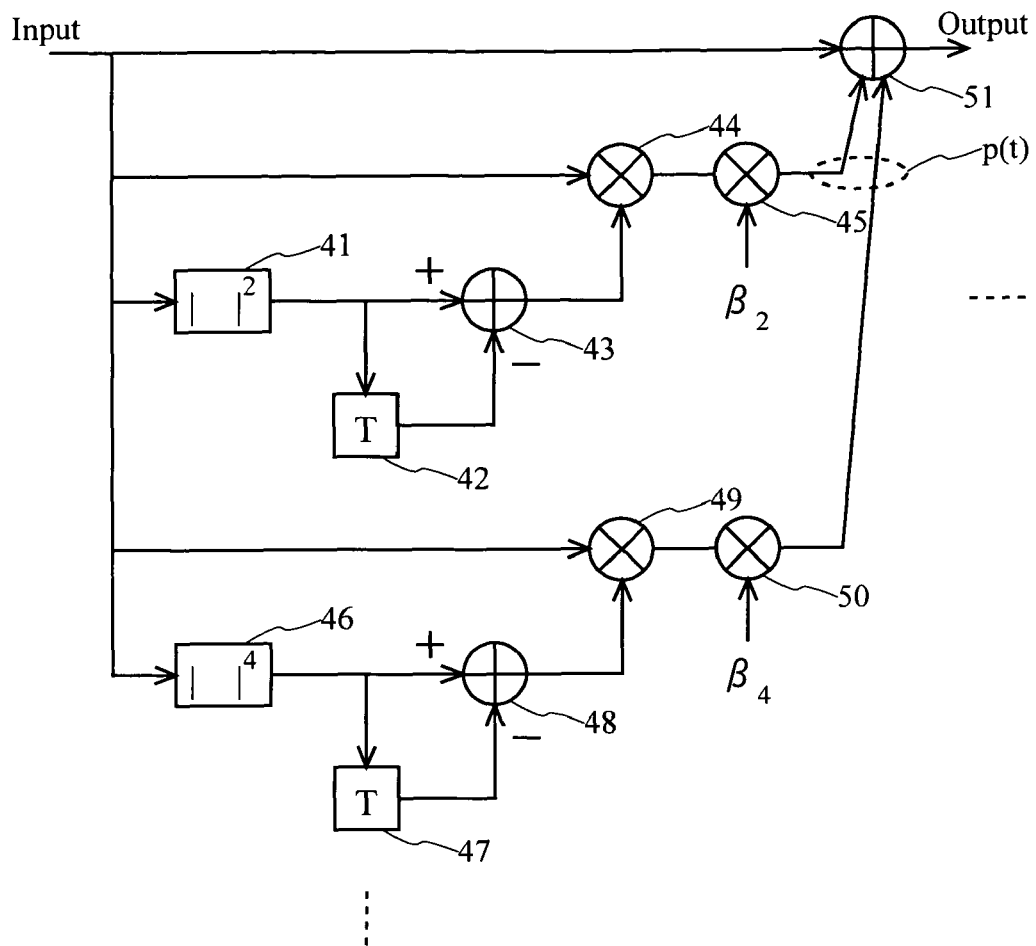
FIG. 4 is a view of an exemplary configuration of a memory effect predistorter.

FIG. 4 shows as reference an exemplary configuration of a memory effect predistorter using a power series expansion. The memory effect predistorter according to the present embodiment has an exemplary configuration of the principle of the predistorter 1 shown in FIG. 1.

The memory effect predistorter according to the present embodiment includes a square detecting section 41, a delay circuit 42, a subtractor 43, a multiplier 44, and a complex multiplier 45 as a processing section for second order terms. The predistorter also includes a biquadratic detecting section 46, a delay circuit 47, a subtractor 48, a multiplier 49, and a complex multiplier 50 as a processing section for fourth order terms. The predistorter further includes similar processing sections (not shown in the drawing) for sixth and following even-ordered terms. It is noted that since the actual circuit cannot deal with infinite order terms, processing sections for up to any practically available order (second or any following even-ordered) may be provided.

The memory effect predistorter according to the present embodiment also includes an adder 51 as a processing section common to all orders.

In the memory effect predistorter according to the present embodiment, the input signal is a complex digital baseband signal.

In the processing section for second order terms, the square detecting section 41 detects (calculates, for example) the square value of the input signal to the predistorter and the delay circuit 42 delays the output (square value) of the square detecting section 41 by U [sec] (preferably one clock time). The subtractor 43 subtracts the output (square value) of the square detecting section 41 in the preceding U [sec] from the output (square value) of the square detecting section 41. Thus, the output from the subtractor 43 is a differential square value.

Then the multiplier 44 multiplies the differential square value by the input signal. The resulting output signal of the multiplication corresponds to a re-modulated carrier signal having third order frequency components around the carrier frequency.

The complex multiplier 45 multiplies the output signal of the multiplier 44 by the coefficient $\beta_2$ in the predistorter. The coefficient $\beta_2$ in the predistorter is a complex number, being set so that the control section (not shown in FIG. 4) can compensate for distortion.

In the processing section for fourth order terms, the biquadratic detecting section 46 detects (calculates, for example) the biquadratic value of the input signal to the predistorter and the delay circuit 47 delays the output (biquadratic value) of the biquadratic detecting section 46 by U [sec] (preferably one clock time). The subtractor 48 subtracts the output (biquadratic value) of the biquadratic detecting section 46 in the preceding U [sec] from the output (biquadratic value) of the biquadratic detecting section 46. Thus, the output from the subtractor 48 is a differential biquadratic value.

Then the multiplier 49 multiplies the differential biquadratic value by the input signal. The resulting output signal of the multiplication corresponds to a re-modulated carrier signal having fifth order frequency components around the carrier frequency.

The complex multiplier 50 multiplies the output signal of the multiplier 49 by the coefficient $\beta_4$ in the predistorter. The coefficient $\beta_4$ in the predistorter is a complex number, being set so that the control section (not shown in FIG. 4) can compensate for distortion.

The same processing as above is performed also in the processing sections for sixth and following even-ordered terms.

Then the adder 51 inputs and adds (sums up) all signals output from the processing systems (complex multipliers 45, 50 . . . ) for even-ordered terms and the input signal and outputs the result of the addition as an output signal from memory effect predistorter (to the D/A converter 2 in FIG. 1).

It is noted that U [sec] above may be a value "one clock time×positive integer", for example.

With reference to FIG. 2, an example of an arithmetic expression using a power series expansion according to the related art will be shown for the case where such a memory effect predistorter as shown in FIG. 4 is used.

In the present embodiment, the output signal p(t) of the memory effect predistorter is as expressed in Formula 27.

However, there has been a problem that a longer convergence time is required in the case of adapting $\beta_2, \beta_4 \ldots$, as is the case with the memoryless predistorter (coefficients in the predistorter adapted to compensate for AM-AM and AM-PM conversions) according to the first embodiment.

Formula 27

$$p(t)=\beta_2\{|x(t)|^2-|x(t-U)|^2\}x(t)+\beta_4\{|x(t)|^4-|x(t-U)|^4\}x(t)+ \quad \text{(Formula 27)}$$

Next will be described an embodiment of the present invention in detail.

In order to solve the above-described problem, the present embodiment introduces and uses a set of orthogonal polynomials as a generating polynomial for reverse characteristics of the memory effect characteristics.

The present embodiment uses a set of orthogonal polynomials to orthogonalize multiple generating polynomials of the predistorter so that coefficients become independent not to affect each other and thereby the convergence time is shortened. The following shows an example.

Formula 27 is altered as expressed in Formulas 28 and 29.

Formula 28

$$p(t) = B_2\Phi_2(x(t)) + B_4\Phi_4(x(t)) + B_6\Phi_6(x(t)) + \ldots + B_M\Phi_M(x(t)) \quad \text{(Formula 28)}$$

Formula 29

$$\Phi_2(x(t)) = \phi_{22}\{|x(t)|^2 - |x(t-U)|^2\}x(t) \quad \text{(Formula 29)}$$

$$\Phi_4(x(t)) = \phi_{42}\{|x(t)|^2 - |x(t-U)|^2\}x(t) + \phi_{44}\{|x(t)|^4 - |x(t-U)|^4\}x(t)$$

$$\Phi_6(x(t)) = \phi_{62}\{|x(t)|^2 - |x(t-U)|^2\}x(t) +$$
$$\phi_{64}\{|x(t)|^4 - |x(t-U)|^4\}x(t) +$$
$$\phi_{66}\{|x(t)|^6 - |x(t-U)|^6\}x(t)$$

...

$$\Phi_M(x(t)) = \phi_{M2}\{|x(t)|^2 - |x(t-U)|^2\}x(t) +$$
$$\phi_{M4}\{|x(t)|^4 - |x(t-U)|^4\}x(t) +$$
$$\phi_{M6}\{|x(t)|^6 - |x(t-U)|^6\}x(t) + \ldots +$$
$$\phi_{MM}\{|x(t)|^M - |x(t-U)|^M\}x(t)$$

Here, $\phi_{ij}$ is a real number and M is an even number.

When Formula 13 is satisfied for the input signal x(t) at a certain time (0 to T), $\phi$ ($\phi_2$ to $\phi_M$) in Formula 29 are mutually orthogonal, as is the case in the first embodiment.

For simplification of description, two cases are shown including $\phi_2$ and $\phi_4$.

In this case, since three equations expressed in Formula 30 are provided for unknowns $\phi_{22}$, $\phi_{42}$, and $\phi_{44}$, these equations can be solved, as is the case with the predistorter adapted to compensate for AM-AM and AM-PM conversions according to the first embodiment.

Formula 30

$E[\Phi_2 \Phi_2^*]=1$ $E[\Phi_2 \Phi_4^*]=0$ $E[\Phi_4 \Phi_4]=1$ (Formula 30)

Even polynomials having higher order terms can also be orthogonalized in the same way.

Then the relationship between $\beta_2, \beta_4, \beta_6 \ldots \beta_M$ and $\beta_2, \beta_4, \beta_6 \ldots \beta_M$ can be obtained, as is the case in Formula 26 shown in the first embodiment.

Thus, the coefficient $B_i$ in the predistorter affects only $\phi_i$, that is, can be obtained independently of the coefficients in the other predistorter $B_j (i \neq j)$, which allows the convergence time to be shortened.

As described heretofore, in the amplifier with a predistorter according to the present embodiment, a set of orthogonal polynomials is used to learn the adaptive coefficients in the memory effect predistorter.

Therefore, in the amplifier with a predistorter according to the present embodiment, use of a set of orthogonal polynomials causes the adaptive coefficients in the predistorter to be made orthogonal, whereby the convergence time of the distortion compensation table 12 can be shortened, resulting in an improvement in efficiency.

Specifically, the present embodiment is directed to a predistorter adapted to compensate for memory effects by raising an input signal to an even power and using a difference signal between the raised signal and its delayed signal, in which a set of orthogonal polynomials is used to learn the adaptive coefficients in the predistorter so that the coefficients in the predistorter adapted to compensate for memory effects can be adapted fast.

It is noted that in the predistorter 1 (memory effect predistorter) according to the present embodiment, the function of the amplitude detecting section 11 constitutes level detection means for input signals; the functions of the directional coupler 5, down-converter 6, and A/D converter 7 in the feedback system constitute signal acquisition means for feedback signals; the function of the control section 14 for acquiring (updating in the present embodiment) a correspondence between the level of an input signal and a control coefficient for predistortion (contents of the distortion compensation table 12) through processing using a set of orthogonal polynomials constitutes correspondence acquisition means; the function of the distortion compensation table 12 constitutes correspondence storage means; and the function of the predistortion executing section 13 constitutes predistortion executing means. Here in the present embodiment, the feedback system can also be taken as a part of the processing section in the predistorter 1.

Embodiment 3

A third embodiment of the present invention will be described.

The present embodiment illustrates the case of using a memoryless predistorter and a memory effect predistorter in parallel.

Figure 5:
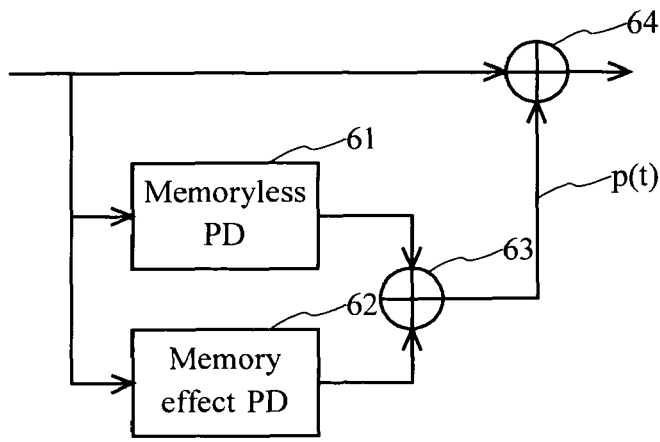
FIG. 5 is a view of an exemplary configuration of a predistorter.

FIG. 5 shows an exemplary configuration of a predistorter according to an embodiment of the present invention.

The predistorter according to the present embodiment is adapted to compensate for AM-AM and AM-PM conversions as well as memory effects.

The predistorter according to the present embodiment includes a memoryless predistorter (memoryless PD) 61, a memory effect predistorter (memory effect PD) 62, and adders 63 and 64. In the present embodiment, the memoryless PD 61 and the memory effect PD 62 are provided in parallel.

Here, the memoryless PD 61 may be one having such a principle configuration as shown in FIG. 3, while the memory effect PD 62 may be one having such a principle configuration as shown in FIG. 4.

For input signals to the predistorter according to the present embodiment, the memoryless PD 61 compensates for AM-AM and AM-PM conversions, while the memory effect PD 62 compensates for memory effects, and the adder 63 adds the signals after these compensations, and then the adder 64 adds the resulting signal p(t) of the addition and the input signal to the predistorter to output the resulting signal of the addition.

In the present embodiment, the memoryless PD 61 and the memory effect PD 62 are separate processing sections and have their respective different distortion compensation tables (both similar to the distortion compensation table 12 shown in FIG. 1).

It is noted that it can be considered in the present embodiment that the memoryless PD 61 and the memory effect PD 62 correspond to the predistorter 1 shown in FIG. 1, and that the adder 27 in the memoryless PD shown in FIG. 3 and the adder 51 in the memory effect PD shown in FIG. 4 are integrated to be the adder 64 shown in FIG. 5.

The present embodiment introduces and uses a set of orthogonal polynomials as a generating polynomial for reverse characteristics of the nonlinear characteristics.

The present embodiment uses a set of orthogonal polynomials to orthogonalize multiple generating polynomials of the predistorter so that coefficients become independent not to affect each other and thereby the convergence time is shortened. The following shows an example.

In the present embodiment, output signals of the predistorters 61 and 62 are added in the adder 63, and the resulting signal p(t) of the addition, which applies reverse characteristics of the nonlinear characteristics, is added with the input signal in the adder 64.

Based on Formulas 4 and 27, p(t) is as expressed in Formula 31.

In the present embodiment, Formula 31 is altered as expressed in Formulas 32 and 33.

Formula 31

$$p(t) = \beta_2\{|x(t)|^2 - |x(t-U)|^2\}x(t) + \alpha_3|x(t)|^2 x(t) + \beta_4\{|x(t)|^4 - |x(t-U)|^4\}x(t) + \alpha_5|x(t)|^4 x(t) + \beta_6\{|x(t)|^6 - |x(t-U)|^6\}x(t) + \alpha_7|x(t)|^6 x(t) + \ldots$$ (Formula 31)

Formula 32

$$p(t) = B_2\Phi_2(x(t)) + A_3\Phi_3(x(t)) + B_4\Phi_4(x(t)) + A_5\Phi_5(x(t)) + B_6\Phi_6(x(t)) + A_7\Phi_7(x(t)) + \ldots + B_M\Phi_M(x(t)) + A_N\Phi_N(x(t))$$ (Formula 32)

Formula 33

$$\Phi_2(x(t)) = \phi_{22}\{|x(t)|^2 - |x(t-U)|^2\}x(t)$$
$$\Phi_3(x(t)) = \phi_{32}\{|x(t)|^2 - |x(t-U)|^2\}x(t) + \phi_{33}|x(t)|^2 x(t)$$
$$\Phi_4(x(t)) = \phi_{42}\{|x(t)|^2 - |x(t-U)|^2\}x(t) + \phi_{43}|x(t)|^2 x(t) + \phi_{44}\{|x(t)|^4 - |x(t-U)|^4\}x(t)$$
$$\Phi_5(x(t)) = \phi_{52}\{|x(t)|^2 - |x(t-U)|^2\}x(t) + \phi_{53}|x(t)|^2 x(t) + \phi_{54}\{|x(t)|^4 - |x(t-U)|^4\}x(t) + \phi_{55}|x(t)|^4 x(t)$$
$$\Phi_6(x(t)) = \phi_{62}\{|x(t)|^2 - |x(t-U)|^2\}x(t) + \phi_{63}|x(t)|^2 x(t) + \phi_{64}\{|x(t)|^4 - |x(t-U)|^4\}x(t) + \phi_{65}|x(t)|^4 x(t) + \phi_{66}\{|x(t)|^6 - |x(t-U)|^6\}x(t)$$ (Formula 33)

Also in this case, since equations are provided for the same number of unknowns as expressed in Formula 34, the equations can be solved to obtain $\phi_{ij}$.

In this case, $B_2, A_3, B_4, A_5, B_6, A_7 \ldots$ are independent of each other, whereby the convergence time is shortened.

In the present embodiment, the interaction between the memoryless PD 61 and the memory effect PD 62 is also included in Formula 33, and all the coefficients $A_i$ and $B_j$ can be orthogonalized.

Formula 34

$$E[\Phi_2\Phi_2^*] = 1$$
$$E[\Phi_2\Phi_3^*] = 0, E[\Phi_3\Phi_3^*] = 1$$
$$E[\Phi_2\Phi_4^*] = 0, E[\Phi_3\Phi_4^*] = 0, E[\Phi_4\Phi_4^*] = 1$$
$$E[\Phi_2\Phi_5^*] = 0, E[\Phi_3\Phi_5^*] = 0, E[\Phi_4\Phi_5^*] = 0, E[\Phi_5\Phi_5^*] = 1$$
$$E[\Phi_2\Phi_6^*] = 0, E[\Phi_3\Phi_6^*] = 0, E[\Phi_4\Phi_6^*] = 0,$$
$$E[\Phi_5\Phi_6^*] = 0, E[\Phi_6\Phi_6^*] = 1$$ (Formula 34)
...

As described heretofore, in the amplifier with a predistorter according to the present embodiment, a set of orthogonal polynomials is used to learn the adaptive coefficients in the memoryless and memory effect predistorters.

Therefore, in the amplifier with a predistorter according to the present embodiment, use of a set of orthogonal polynomials causes the adaptive coefficients in the predistorters to be made orthogonal, whereby the convergence time of the distortion compensation table can be shortened, resulting in an improvement in efficiency.

Specifically, the present embodiment is directed to a predistorter with a memoryless predistorter and a memory effect predistorter being coupled in parallel, in which a set of orthogonal polynomials is used to learn the adaptive coefficients in the predistorters so that the coefficients in the memoryless and memory effect predistorters are made orthogonal and can be adapted fast.

It is noted that in the predistorter according to the present embodiment (in which the memoryless predistorter 61 having first predistortion executing means and the memory effect predistorter 62 having second predistortion executing means are arranged in parallel), the function of the amplitude detecting section 11 constitutes level detection means for input signals; the functions of the directional coupler 5, down-converter 6, and A/D converter 7 in the feedback system constitute signal acquisition means for feedback signals; the function of the control section 14 for acquiring (updating in the present embodiment) a correspondence between the level of an input signal and a control coefficient for predistortion (contents of the distortion compensation table 12) through processing using a set of orthogonal polynomials constitutes correspondence acquisition means; the function of the distortion compensation table 12 constitutes correspondence storage means; and the function of the predistortion executing section 13 constitutes predistortion executing means. Here in the present embodiment, the feedback system can also be taken as a part of the processing section in the predistorter.

Also, in the present embodiment, the amplitude detecting section 11 may be provided separately or in common for each of the memoryless predistorter 61 and the memory effect predistorter 62, while the distortion compensation table 12 and the predistortion executing section 13 are provided separately, and the control section 14 and the feedback system (directional coupler 5, down-converter 6, and A/D converter 7) are provided in common.

Embodiment 4

A fourth embodiment of the present invention will be described.

The present embodiment illustrates an update method in the case of using an adaptive algorithm for coefficients $A_i$ and $B_j$ in a predistorter.

The related art and problems will first be described in detail.

Figure 7:
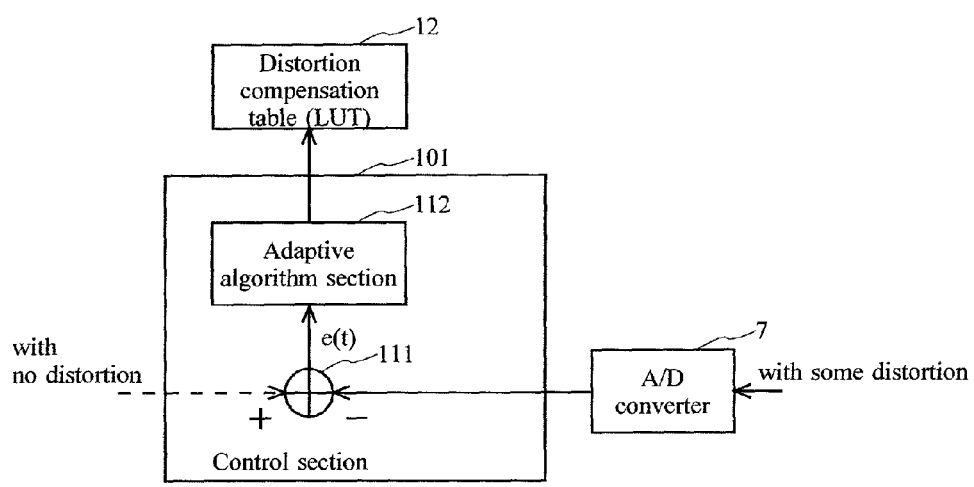
FIG. 7 is a view of an exemplary configuration of a control section according to the related art.

FIG. 7 shows an exemplary configuration concerning arithmetic operations of a control section 101 (corresponding to the control section 14 shown in FIG. 1) according to the related art. It is noted that FIG. 7 also includes A/D converter 7 and distortion compensation table 12.

The control section 101 according to the present embodiment includes a subtractor 111 and an adaptive algorithm section 112.

The subtractor 111 subtracts the input signal input from the A/D converter 7 from the input signal to the predistorter to obtain the difference between the input signal (with no distortion) to the predistorter and the feedback signal (with some distortion) from the amplifier (power amplifier section 4 in the present embodiment) as an error signal e(t). In the present embodiment, the error signal e(t) is based on nonlinear distortion components.

The adaptive algorithm section 112 uses the error signal e(t) obtained through the subtractor 111 to update the coefficients in the predistorter (contents of the distortion compensation table 12) with an LMS algorithm expressed in Formulas 35 and 36.

Formula 35

$$Ai[t+1] = Ai[t] + \mu(E[\Phi_i^*(t)e(t)]/E[|\Phi_i(t)|^2])$$ (Formula 35)

Formula 36

$$Bi[t+1] = Bi[t] + \mu(E[\Phi_i^*(t)e(t)]/E[|\Phi_i(t)|^2])$$ (Formula 36)

Here, $0<\mu\leq1$ and the magnitude of the error is normalized with $E[|\phi_i(t)|2]$ in the denominator. The error signal e(t) is as expressed in Formula 37.

In Formula 37, x(t) represents an input signal to the predistorter, and PAout represents an input signal to the control section 101, a feedback of an output signal of the amplifier. Also, "τ" represents a time synchronization error, and "Gain" represents a coefficient for amplitude adjustment based on the gain of the amplifier.

Formula 37

$$e(t)=x(t)-PAout(t-\tau)/Gain \quad \text{(Formula 37)}$$

In the case above, it is important to adjust the delay time and level (amplitude). If distortion is compensated completely, the error results in e(t)=0. However, if there is a delay time difference (i.e. τ≠0) or Gain*x(t)≠PAout(t), the error results in e(t)≠0, where it seems as if distortion will remain.

For example, since the ratio between desired signal power and distortion power is very large as much as 30 to 60 [dB], it is important to adjust the ratio. In order to solve this problem, complex and accurate arithmetic operations are required, suffering from a problem that the circuit size increases.

Next will be described the present embodiment in detail.

FIG. 6A shows an exemplary configuration concerning arithmetic operations of a control section 14a (corresponding to the control section 14 shown in FIG. 1) according to an embodiment of the present invention in the case where an analog filter is used. Specifically, there are shown the control section 14a including: a band-limiting filter 71 having a feature of passing signals outside of the desired signal bands; an A/D converter 7; and an adaptive algorithm section 81 and a distortion compensation table 12.

In the configuration of the present embodiment, the analog band-limiting filter 71 is provided between the down-converter 6 and the A/D converter 7 (preceding the A/D converter 7).

Then the band-limiting filter 71 filters output signals from the down-converter 6 to extract signals outside of the desired signal bands as error signals e(t). The A/D converter 7 digitalizes each of the extracted error signals e(t), and based on the error signal e(t), the adaptive algorithm section 81 in the control section 14a updates the coefficients in the predistorter (contents of the distortion compensation table 12) with an LMS algorithm.

FIG. 6B shows an exemplary configuration concerning arithmetic operations of a control section 14b (corresponding to the control section 14 shown in FIG. 1) according to an embodiment of the present invention in the case where a digital filter is used. Specifically, there are shown the control section 14b including: an A/D converter 7; a band-limiting filter 91 having a feature of passing signals outside of the desired signal bands; and an adaptive algorithm section 92 and a distortion compensation table 12.

In the configuration according to the present embodiment, the digital band-limiting filter 91 is provided inside the control section 14b (following the A/D converter 7).

Then in the control section 14b, the band-limiting filter 91 filters input signals input from the A/D converter 7 to extract signals outside of the desired signal bands as error signals e(t), and based on the extracted error signals e(t), the adaptive algorithm section 92 updates the coefficients in the predistorter (contents of the distortion compensation table 12) with an LMS algorithm.

It is noted that although the present embodiment shows the case where band-limiting filters 71 and 91 are used, band-pass filters having the same filtering features may be used as another exemplary configuration. Such band-limiting filters typically include FIR (Finite Impulse Response) filters, for example.

Advantages of the configuration according to the present embodiment shown in FIGS. 6A and 6B will here be described in contrast with the configuration according to the related art shown in FIG. 7.

In the configuration according to the related art shown in FIG. 7, the power level of the frequency of a distortion component contained in a feedback signal is, for example, taken as an error signal e(t), and if the gain (Gain) and/or phase (time "τ") of the feedback signal is shifted from the original signal, there occurs an error, which requires level adjustment, etc.

In contrast, in the configuration according to the present embodiment shown in FIGS. 6A and 6B, the band-limiting filters 71 and 91 use only a feedback signal to extract signal components other than desired waves (i.e. distortion components) as error signals (e.g. time-domain error vectors within distortion bands), whereby the accuracy required for timing adjustment can be reduced.

Thus, since the present embodiment requires no level adjustment, etc., as in the configuration according to the related art shown in FIG. 7 and high-power desired signals are not contained, the accuracy required for delay time is reduced. It is noted that distortion existing within the desired bands is removed by the band-limiting filters 71 and 91 and therefore not contained in the error signal e(t), which will not present a particular problem because error signals e(t) within the desired signal bands approach zero as error signals outside of the desired signal bands approach zero.

As described heretofore, in the amplifier with a predistorter according to the present embodiment, desired signals are attenuated or removed from an output signal of the amplifier (power amplifier section 4 in the present embodiment) through the band-limiting filter 71 or 91 to obtain an error signal e(t) and thereby to learn the coefficients in the predistorter.

Figure 6:
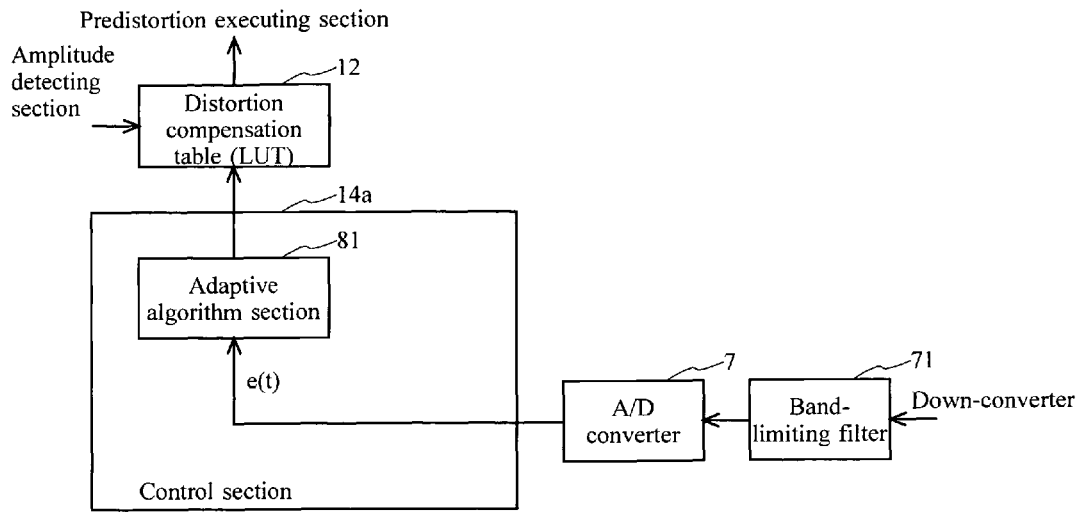
FIG. 6A and FIG. 6B are views of exemplary configurations of control sections.
Figure 6:
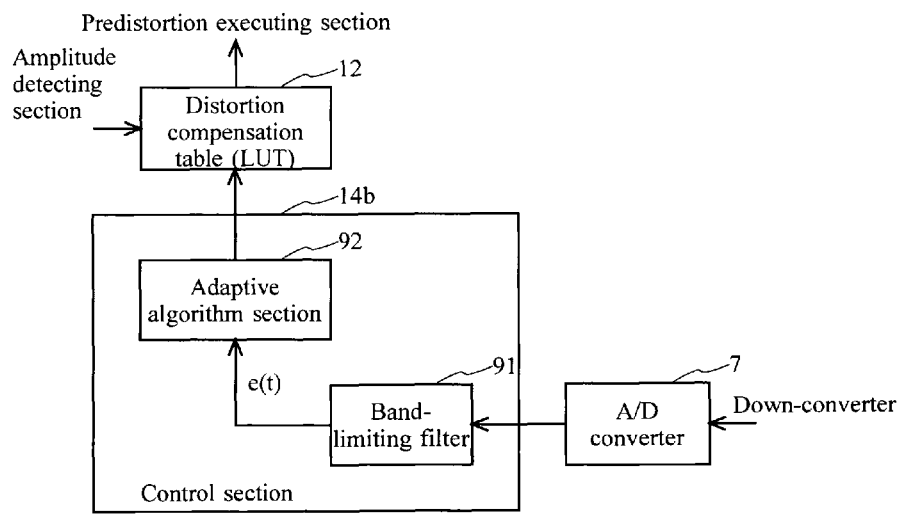

Therefore, in the amplifier with a predistorter according to the present embodiment, the signal with desired signal bands being removed through the band-limiting filter 71 or 91 is used as an error signal e(t), whereby there is no need for complicated processing (arithmetic operations) in, for example, the configuration shown in FIG. 6 and the circuit size can be reduced, and further the simplification of the processing allows the convergence time to be shortened. Thus, in the present embodiment, predistortion coefficients can be converged efficiently.

Here, although the present embodiment shows the case where the configurations shown in FIGS. 6A and 6B are applied to the first to the third embodiments in which a set of orthogonal polynomials is used to update the coefficients in the predistorter, the configurations shown in FIGS. 6A and 6B may be applied, as another exemplary configuration, to various configurations (such as those conventionally known) in which no orthogonal polynomial is used to update the coefficients in the predistorter to achieve the same effect.

Although the present embodiment shows the case where an LMS algorithm is used to update the coefficients in the predistorter, RLS algorithms and the like may be used.

It is noted that in the predistorter 1 according to the present embodiment, the function of the amplitude detecting section 11 constitutes level detection means for input signals; the functions of the directional coupler 5, down-converter 6, and A/D converter 7 in the feedback system constitute signal acquisition means for feedback signals; the function of the band-limiting filter 71 or 91 constitutes filter means; the function of the control section 14 for acquiring (updating in the present embodiment) a correspondence between the level of an input signal and a control coefficient for predistortion (contents of the distortion compensation table 12) through arithmetic operations in the adaptive algorithm section 81 or 92 constitutes correspondence acquisition means; the function of the distortion compensation table 12 constitutes correspondence storage means; and the function of the predistortion executing section 13 constitutes predistortion executing means. Here in the present embodiment, the feedback system can also be taken as a part of the processing section in the predistorter 1.

Here, the configurations of the systems and apparatuses according to the present invention are not necessarily restricted to those described heretofore, and various configurations may be used. The present invention may also be provided as: a method or procedure for performing the processing according to the present invention; a program for achieving such a method or procedure; a recording medium for recording such a program; or various systems and apparatuses.

The present invention may also be applied to various fields without being necessarily restricted to those described heretofore.

In addition, various processing performed in the systems and apparatuses according to the present invention may be controlled, for example, in such a manner that in hardware resources including processors and memories, a processor runs a control program stored in a ROM (Read Only Memory). Alternatively, function means for performing such processing may be configured as separate hardware circuits, for example.

The present invention may also be grasped as a computer-readable recording medium storing the control program above, such as a floppy (registered trademark) disk or a CD (Compact Disk)-ROM, or the program (itself), where the processing according to the present invention can be performed by inputting the control program from the recording medium to the computer and making the processor run the program.

What is claimed is:

1. A predistorter adapted to compensate for distortion generated in an amplifier, comprising:
    a level detection means for detecting a level of a signal input to said predistorter;
    a signal acquisition means for acquiring a signal output from the amplifier as a feedback signal;
    a correspondence acquisition means for independently updating predistortion coefficients of multiple polynomials in a set of orthogonal polynomials, the multiple polynomials being a function of the signal input to said predistorter and are mutually orthogonal, and for acquiring a correspondence between the level of the signal input to said predistorter and a control coefficient for predistortion based on the updated predistortion coefficients; and
    a predistortion executing means for applying distortion for predistortion to the signal input to said predistorter in accordance with the control coefficient for predistortion that corresponds to the level detected by said level detection means based on the correspondence acquired by said correspondence acquisition means, and outputting a distortion-applied-signal to the amplifier,
    wherein said correspondence acquisition means updates the predistortion coefficients of the multiple polynomials in the set of orthogonal polynomials so that a distortion component contained in the feedback signal acquired by said signal acquisition means is reduced,
    wherein said predistortion executing means comprises: a first predistortion executing means that serves as a memoryless predistorter adapted to compensate for AM-AM and AM-PM characteristics; and a second predistortion executing means that serves as a memory effect predistorter adapted to compensate for memory effects,
    wherein said first and second predistortion executing means are provided in parallel, and
    said correspondence acquisition means is adapted to update a predistortion coefficient for each of said first and second predistortion executing means expressed using the set of orthogonal polynomials, and to acquire a correspondence between the level of the signal input to said predistorter and a control coefficient for predistortion for each of said first and second predistortion executing means.

2. The predistorter according to claim 1,
    wherein said signal acquisition means has a filter means for acquiring a signal component with frequency components of desired waves being removed from the acquired feedback signal, and
    wherein said correspondence acquisition means is adapted to use the signal component acquired by said filter means in said signal acquisition means as an error signal to update a predistortion coefficient using an algorithm for reducing the error signal.

3. The predistorter according to claim 1, wherein the multiple polynomials, which comprise the set of orthogonal polynomials and are mutually orthogonal, are set such that the multiple polynomials are mutually orthogonal to a practically available degree based on the length of the signal input to the amplifier, the signal input to the amplifier being used in one update of the predistortion coefficients.

* * * * *